US009594385B2

(12) United States Patent
Mick et al.

(10) Patent No.: US 9,594,385 B2
(45) Date of Patent: Mar. 14, 2017

(54) SYSTEM AND METHOD OF RACK MANAGEMENT

(71) Applicant: Rackspace US, Inc., San Antonio, TX (US)

(72) Inventors: Jason Mick, Converse, TX (US); Dale Lee Bracey, San Antonio, TX (US)

(73) Assignee: Rackspace US, Inc., San Antonio, TX (US)

( * ) Notice: Subject to any disclaimer, the term of this patent is extended or adjusted under 35 U.S.C. 154(b) by 391 days.

(21) Appl. No.: 14/186,905

(22) Filed: Feb. 21, 2014

(65) Prior Publication Data

US 2014/0277807 A1 Sep. 18, 2014

Related U.S. Application Data

(63) Continuation of application No. 13/830,191, filed on Mar. 14, 2013.

(51) Int. Cl.
*G05B 19/04* (2006.01)
*G05D 23/19* (2006.01)
*H05K 7/14* (2006.01)
*H05K 7/20* (2006.01)
(Continued)

(52) U.S. Cl.
CPC ......... *G05D 23/1917* (2013.01); *G06F 1/324* (2013.01); *G06F 1/3206* (2013.01); *G06F 1/3287* (2013.01); *G06F 11/3051* (2013.01); *H05K 7/1492* (2013.01); *H05K 7/1498* (2013.01); *H05K 7/207* (2013.01); *H05K 7/20209* (2013.01); *H05K 7/20836* (2013.01);
(Continued)

(58) Field of Classification Search
None
See application file for complete search history.

(56) References Cited

U.S. PATENT DOCUMENTS

| 2008/0077666 | A1* | 3/2008 | Sekaran | H04L 12/1827 709/204 |
| 2009/0055679 | A1* | 2/2009 | Langford | G06F 11/2038 714/4.1 |
| 2012/0136489 | A1 | 5/2012 | Wang et al. | |

(Continued)

OTHER PUBLICATIONS

Technical Brief, "Scali Manage™ on SGI® Altix® ICE System Quick reference Guide", Chapter 1; SGI Altix ICE 8000 Series System Overview, dated Apr. 2008, 19 pgs.

(Continued)

*Primary Examiner* — Sean Shechtman
(74) *Attorney, Agent, or Firm* — Haynes and Boone, LLP

(57) ABSTRACT

A rack management method and system is disclosed. The method includes detecting the presence of a computing device releasably mounted in a frame, the detecting based on an electrical connection established between a configuration bar disposed in a rear portion of the frame and the computing device, and determining a physical location of the computing device within the frame based on the electrical connection. The method also includes retrieving management information about the computing device from a profile storage disposed within the computing device via the electrical connection and storing the management information in a management table, the management table associating the computing device with the physical location within the frame.

31 Claims, 11 Drawing Sheets

(51) Int. Cl.
    *G06F 11/30*    (2006.01)
    *G06F 1/32*    (2006.01)
(52) U.S. Cl.
    CPC ....... *Y02B 60/1217* (2013.01); *Y02B 60/1282* (2013.01)

(56) References Cited

U.S. PATENT DOCUMENTS

2013/0138997 A1* 5/2013 Wang ................. H04L 41/0856
                                                       714/4.11

OTHER PUBLICATIONS

Internet Brief, "Dell DRAC", Wikipedia.org., as revised Feb. 13, 2013, 7 pgs.
Cole, David; "Managing the Data Center One Rack at a Time", No Limits Software White Paper #6, Jan. 2013, 13 pgs.
Internet Brief, EMX-Smart Rack Controller and Sensors, Raritan Products (product description), as archived Nov 2, 2012, 6 pgs.
Internet Brief, "Data Center Infrastructure Management", Raritan Products(product description), as archived Jan. 23, 2013, 1 pg.
Wallen, Jack; "DIY: Data Center Rack Management Made Easy", Technical Brief, Aug. 5, 2011, 3 pgs.
Internet Brief, RackTables, http://racktables.org., Product Description, as archived Jan. 17, 2013, 1 pg.

* cited by examiner

SYSTEM AND METHOD OF RACK MANAGEMENT

CROSS-REFERENCE

This application is a continuation of U.S. patent application Ser. No. 13/830,191, filed on Mar. 14, 2013, the entirety of which is hereby incorporated by reference

BACKGROUND

The present disclosure relates generally to rack management, and more particularly to systems and methods for management of computing devices mounted in a rack system.

Data centers with hundreds or thousands of computing devices often mount such computing devices into racks for organizational and space efficiency purposes. A single rack may contain a plurality of servers, a plurality of storage devices, one or more network appliances to connect the devices to a network, and a power supply to power the devices. Traditionally, computing devices mounted within a rack have been individually managed, for instance, with a keyboard and monitor physically attached to the devices, or remotely via baseboard management controllers within the devices. Although, management solutions have been devised that aggregate control over the computing devices in a rack, such solutions lacked functionality with respect to power management, thermal management, redundancy in the event of control hardware failure, and device detection and configuration. Accordingly, although existing rack management methods and structures have been satisfactory for their intended purposes, they have not been entirely satisfactory in all respects.

SUMMARY OF THE INVENTION

Figure 1:
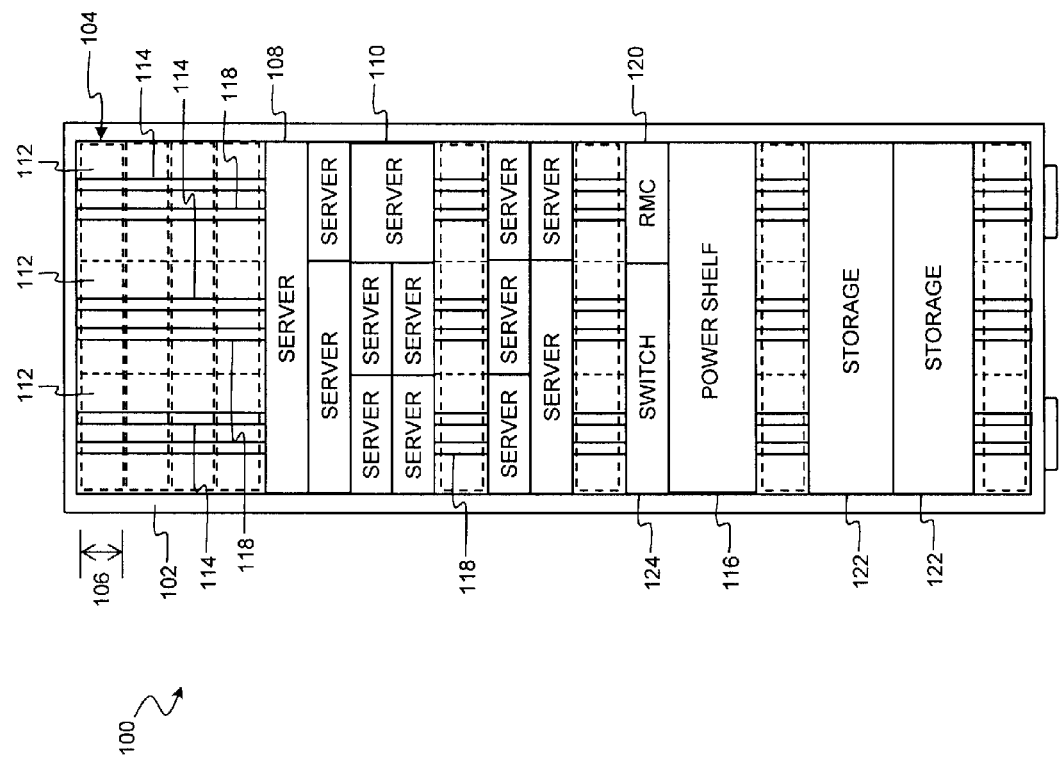
FIG. 1 is a functional block diagram of a rack system including a rack management controller (RMC) according to aspects to the present disclosure.

In one exemplary aspect, the present disclosure is directed to a rack management method. The method includes detecting the presence of a computing device releasably mounted in a frame, the detecting based on an electrical connection established between a configuration bar disposed in a rear portion of the frame and the computing device, and determining a physical location of the computing device within the frame based on the electrical connection. The method also includes retrieving management information about the computing device from a profile storage disposed within the computing device via the electrical connection and storing the management information in a management table, the management table associating the computing device with the physical location within the frame.

In another exemplary aspect, the present disclosure is directed to a rack management system. The system includes a frame configured to support computing devices releasably mounted therein, a configuration bar disposed in a rear portion of the frame, the configuration bar having a first coupling assembly, and a computing device releasably mounted within the frame such that a second coupling assembly disposed on the computing device is releasably coupled to the first coupling assembly, an electrical connection being established between the first coupling assembly and the second coupling assembly. The system also includes a profile storage disposed within the computing device that stores management information about the computing device, and a rack management controller in electrical communication with the computing device via the electrical connection and being configured to retrieve the management information from the profile storage via the electrical connection.

In a further exemplary aspect, the present disclosure is directed to a rack system. The system includes a frame configured to support computing devices releasably mounted therein and a configuration bar disposed in a rear portion of the frame. The system also includes a computing device releasably mounted within the frame such that the computing device is releasably coupled to the configuration bar, an electrical connection being established between the computing device and the configuration bar and a profile storage disposed within the computing device that stores management information about the computing device. Further, the system includes a rack management controller having a non-transitory, computer-readable storage medium that stores a plurality of instructions for execution by at least one processor. The instructions include instructions to detect the presence of the computing device within the frame based on the electrical connection and instructions to determine a physical location of the computing device within the frame based on the electrical connection. The instructions also includes instructions to retrieve management information about the computing device from the profile storage via the electrical connection and instructions to store the management information in a management table, the management table associating the computing device with the physical location within the frame.

DETAILED DESCRIPTION

For the purposes of promoting an understanding of the principles of the present disclosure, reference will now be made to the embodiments illustrated in the drawings, and specific language will be used to describe the same. It is nevertheless understood that no limitation to the scope of the disclosure is intended. Any alterations and further modifications to the described devices, systems, and methods, and any further application of the principles of the present disclosure are fully contemplated and included within the present disclosure as would normally occur to one skilled in the art to which the disclosure relates. In particular, it is fully contemplated that the features, components, and/or steps described with respect to one embodiment may be combined with the features, components, and/or steps described with respect to other embodiments of the present disclosure. For the sake of brevity, however, the numerous iterations of these combinations will not be described separately Referring now to FIG. 1, illustrated is a functional block diagram of a rack system 100 according to aspects of the present disclosure. The rack system 100 is comprised of a plurality of discrete computing devices and includes a frame 102 in which the computing devices are releasably mounted. The frame 102 has standardized dimensions such that any piece of hardware that conforms to the rack standards may be mounted therein. In that regard, the frame 102 includes a plurality of virtual partitions 104 that extend the width of the frame 102 and are of equal height 106. In certain embodiments, each partition 104 has a height of 48 mm and a width of 537 mm, but, in other embodiments, each partition may have a different height such as 44.45 mm and may have a different width such as 482.6 mm. Each partition 104 may be referred to as a rack unit or uSpace and the height of rack-mountable computing devices may be measured in the number of rack units they occupy. For example, a computing device may occupy 1 rack unit, 0.5 of a rack unit, or 3 rack units. In the example embodiment of FIG. 1, a server 108 is mounted in the frame 102 and is 1 rack unit in height, whereas a server 110 is 2 rack units in height. Further, the frame 102 is configured to allow up to three individually-powered computing devices to be mounted side-by-side within one of the virtual partitions 104. In that regard, each partition 104 is segmented into three equally-sized power zones 112. Each power zone 112 is associated with a power bar 114 that is disposed at the rear of the rack and provides power to a computing device mounted in the power zone and coupled thereto. The power bars 114 extend the height of the frame 102 and are energized by a power shelf 116 mounted in the frame. In one embodiment, the power shelf 116 outputs 12 volts DC to each power bar 114, but, in other embodiments, the power shelf may output a different DC voltage or may output an AC voltage. Further, in some embodiments, the rack system 100 may include a battery backup system that energizes the power bars in the event that the power shelf fails or ceases to receive power from an external source. In such a scenario, backup batteries may be mounted within the frame 102, or backup batteries may be housed in locations remote to the rack system 100. Additional details about the power bars 114 and power management of the rack will be discussed in association with FIG. 4.

The frame 102 of the rack system 100 further includes a configuration bar 118 respectively disposed in each of the three power zones 112. Each configuration bar 118 runs parallel to a respective one of the power bars 114 and is configured to couple to a computing devices mounted within the frame 102. As such, when a computing device is mounted in the frame 102, it is in electrical communication with one or more of the power bars 114 and is also coupled to one or more of the configuration bars 118. As will be described in more detail in association with FIG. 5, the configuration bars provide data planes through which computing devices report their physical location within the frame 102 and report hardware configuration and attribute information so that they may be centrally managed.

The rack system 100 includes a rack management controller (RMC) 120 that is configured to monitor, control, and otherwise manage computing devices mounted in the frame 102. In general, the RMC 120 collects management information associated with each of the rack-mounted computing devices and performs rack-related management tasks based on the information. To efficiently and accurately perform such management tasks, the RMC 120 maintains real-time records describing the locations, configurations, and tolerances of the computing devices mounted in the rack system 100. Example management tasks carried out by the RMC 120 may include operational status monitoring of computing devices within the rack system, power and cooling management of the rack devices, on-demand hardware provisioning, failover services for other rack management controllers, error logging, and other such management tasks. The RMC 120 further provides a central point of access (i.e., a gateway) through which management communications associated with the computing devices in the rack system 100 may be routed, viewed, and/or aggregated. The various management capabilities and hardware configurations of the RMC 120 will be discussed in greater detail in association with the remaining figures.

In the illustrated embodiment of FIG. 1, the RMC 120 monitors and manages the servers mounted in the frame 102, such as servers 108 and 110, also manages other types of computing hardware in the rack system such as storage devices 122 and a network switch 124. In some embodiments the RMC 120 is operable to provide interfaces through which the switch 124 may be remotely initially configured. In alternative embodiments, the network switch 124 may be replaced with or augmented with other network communication hardware such as a router or a bridge. The storage devices 122 may be any type of devices that provide persistent storage for the servers on the rack system or other remotely-located systems. For example, in one embodiment, each storage device 122 may be a chassis that holds a plurality of hard drives that are either independently addressable (i.e., "just a bunch of disks" or JBOD) or concatenated and presented as a single storage unit. In other embodiments, the storage devices 122 may form a RAID-based storage solution or may be legacy storage devices such as tape drives. The RMC 120 is configured to perform various power, configuration, and monitoring-related functions with respect to the storage devices 122.

One of ordinary skill in the art would recognize that the illustrated embodiment of FIG. 1 is simply an example embodiment and the rack system may include additional and/or different features, devices, capabilities, etc. For instance, the dimensions of frame 102 set forth herein are simply example dimensions and the frame may take on any number of physical configurations depending on the environment in which the rack system is deployed. The computing devices mounted within the frame 102 are similarly just examples, and any additional and/or different types of computing devices and accessories may be mounted in the frame. For example, blade servers, database controllers, network routers, patch panels, backup batteries, diagnostics equipment, graphics processor arrays, hard drive controllers, and any other rack-mountable computing equipment or peripheral that conforms to the rack unit height standard 106 may be mounted in the frame 102. However, as described below, to be fully managed by the RMC 120, a server or other computing device should couple to at least one of the power bars 114 and at least one of the configuration bars 118 when mounted in the frame 102.

Figure 2:
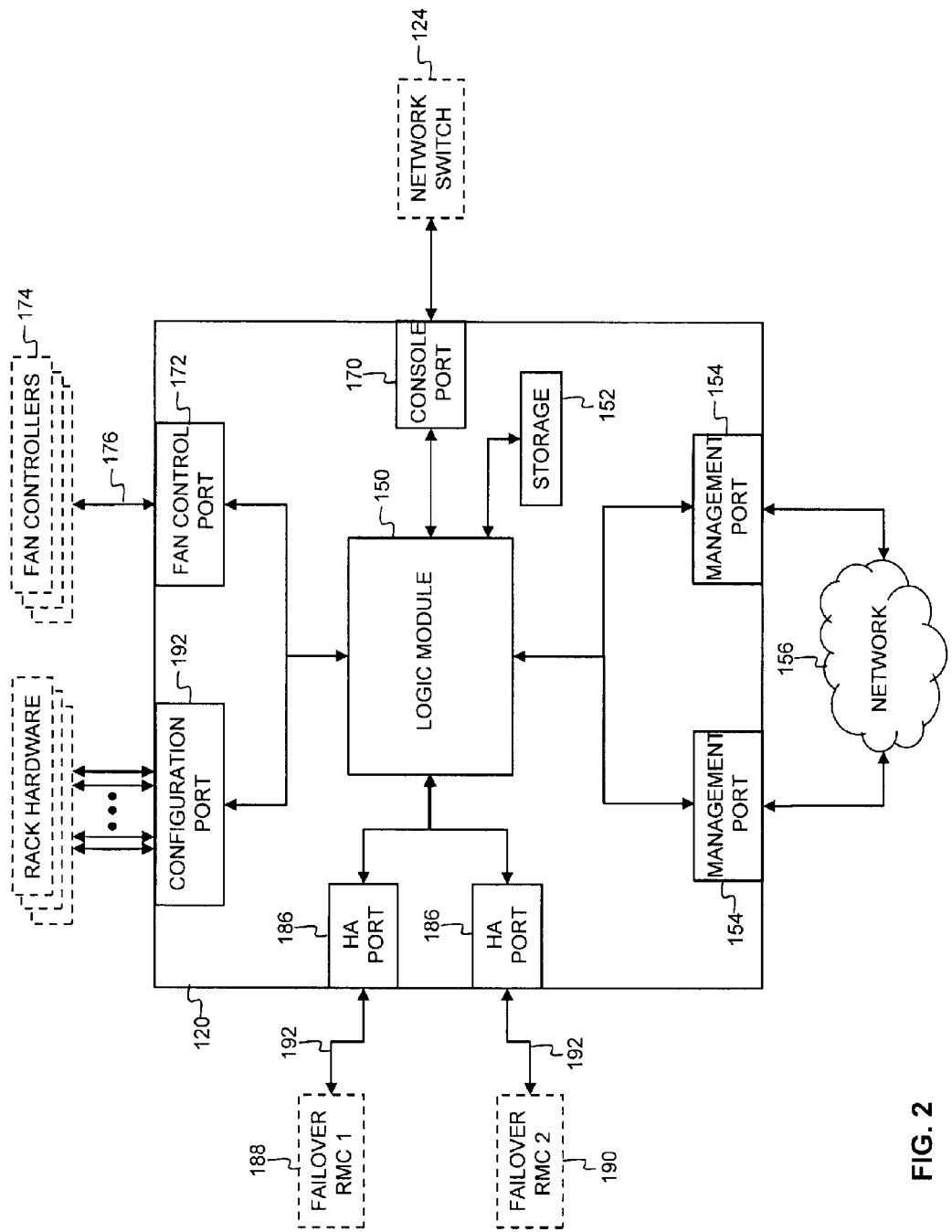
FIG. 2 is a functional block diagram of the rack management controller of FIG. 1.
Figure 3:
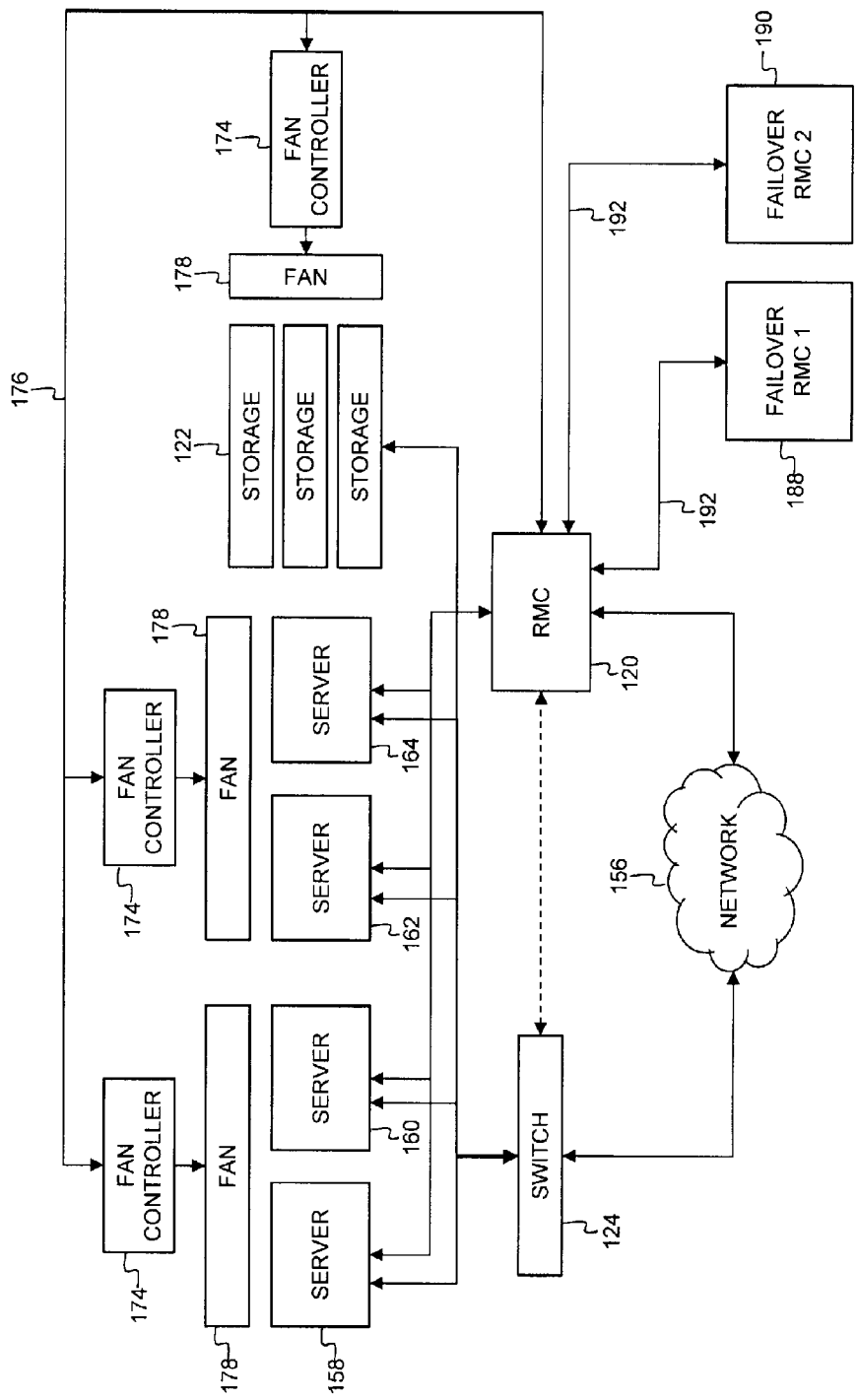
FIG. 3 is a functional block diagram of various components of the rack system including the RMC and the interconnections therebetween.

Referring now to FIG. 2, illustrated is a functional block diagram of the rack management controller (RMC) 120 of FIG. 1 according to aspects to the present disclosure. Referring also to FIG. 3, illustrated is a functional block diagram of various components of the rack system 100 including the RMC 120 and the interconnections therebetween according to aspects to the present disclosure. In the illustrated embodiment of FIG. 2, the RMC 120 is a printed circuit board with mounting hardware configured to attach it to the frame 102 of the rack system 100. However, in other embodiments, the RMC 120 may have other form factors such as that of an adapter card within a computing device, a full-featured server mounted in the frame, an expansion board, or any other suitable form factor either mounted within or independent of the frame. In any case, as shown in FIG. 2, the RMC 120 includes a plurality of components that together are configured to monitor, control, and otherwise manage computing devices mounted in the frame 102.

In more detail, the RMC 120 includes a logic module 150 that is configured to perform data processing tasks, computation tasks, routing tasks, and/or other similar tasks for the RMC. In one embodiment, the logic module 150 is a system-on-a-chip (SoC) that includes a low-power microprocessor such as an ARM-based or Atom-based processor. As a SoC, the logic module 150 further includes on-board random access memory (RAM), peripherals such as timers, and external communication interfaces supporting communication protocols such as Ethernet, Universal Serial Bus (USB), Universal Asynchronous Receiver/Transmitter (UART), FireWire, serial peripheral interface (SPI), and System Management Bus (SMBus). In other embodiments, the logic module 150 is a discrete microprocessor and other system components are independently disposed on the RMC 120. Additionally, in one embodiment, the logic module 150 executes an embedded operating system such as embedded Linux. The operating system may be stored on a non-transitory, computer-readable storage 152 to facilitate execution of computer instructions by the processor. The storage 152 may be a solid-state storage device, a hard disc, an optical disk, a magneto-optical disc, and/or a variety other mass storage devices known in the art. The storage 152 may be embedded within the logic module 150 or it may be independently disposed on the RMC 120. In the illustrated embodiment, the storage 152 further stores hardware attribute information and operational status information about the computing devices in the rack system 100. The RMC 120 stores and retrieves the configuration and operational information from the storage 152 as necessary to manage the components of the rack system 100. As will be discussed in association with FIG. 4, in one embodiment, the logic module 150 maintains a management table in which such configuration and operational information is tracked and updated according to the components installed in the frame 102.

Referring now to both FIGS. 2 and 3, the RMC 120 is interconnected to various components internal and external to the rack system 100. First, the RMC 120 includes one or more management ports 154 through which the RMC manages the computing devices on the rack system 100. In certain embodiments, one of the management ports 154 may be a primary port and the other may be a failover or backup port. In the illustrated embodiment, the management ports 154 are Ethernet-based and communicatively couple the RMC to a network 156. The network 156 may be any type of network such as a local area network (LAN), a wide-area network (WAN), the Internet, an intranet, a management-type network within a data center, or any other type of network known in the art. As shown in FIG. 3, the computing devices of the rack system 100 such as servers 158, 160, 162, and 164 and storage devices 122 are also communicatively coupled to the network 156 via the switch 124. The RMC 120 communicates with out-of-band or in-band management modules (e.g., baseboard management controllers, etc) within the servers 158, 160, 162, and 164 and storage devices 122 via the management ports 154. In one embodiment, the RMC 120 communicates with and manages the computing devices in rack system 100 using Data Center Manageability Interface (DCMI) for out-of-band management, but, in other embodiments, the RMC may use another management standard such as Intelligent Platform Management Interface (IPMI), Desktop and mobile Architecture for System Hardware (DASH), Remote Management Control Protocol (RMCP), or a combination thereof. As an example, the RMC 120, via the management ports 154, may be able to remotely perform at least the following management tasks: power up, power down, or power cycle a computing device; query operational status information such as temperature and power usage of a computing device; alter the power usage of a computing device (e.g., by varying a processor clock speed); alter the speed of an internal fan of a computing device; select a boot image for a computing device; access and change BIOS settings of a computing device; redirect a computing system's input/output via console redirection; access an event log stored on a computing device; query the hardware and software inventory of a computing device; receive event notifications from a computing system. One of ordinary skill in the art would recognize that the above list is not limiting and the RMC 120 may perform various other additional and/or different management tasks associated with the computing devices in the rack system 100.

Figure 8:
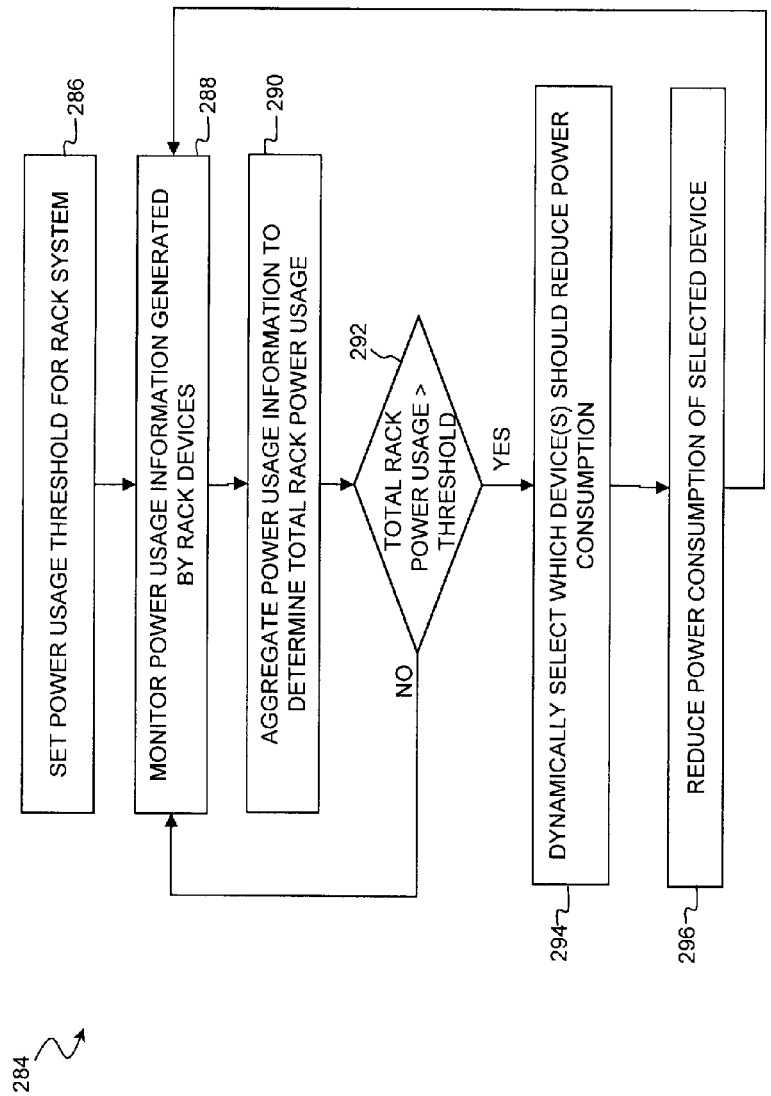
FIG. 8 is a simplified flow chart describing a method for managing total power usage of the computing devices within the rack system of FIG. 1.
Figure 9:
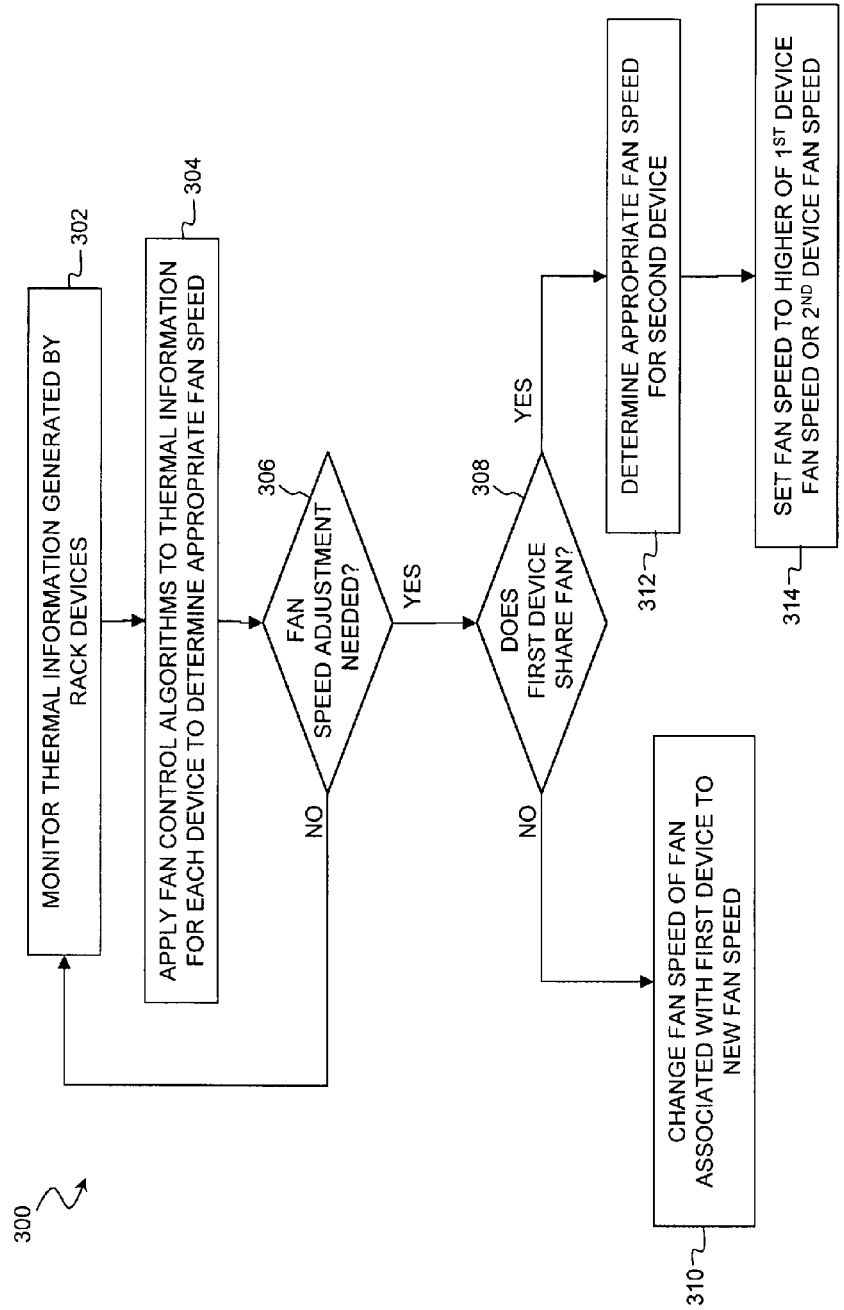
FIG. 9 is a simplified flow chart describing a method for managing thermal characteristics of the computing devices within the rack system of FIG. 1.

The logic module 150 executes the procedures and algorithms to implement the above management tasks. It does so based on configuration and operational status information associated with the computing devices stored in the storage 152. For example, the RMC 120 may periodically request power usage information from each computing device and store the received information in the storage 152. The logic module 150 may then take some management action based on the individual or aggregate power usage of the devices in the rack system 100. FIGS. 8 and 9 describe in more detail management methods performed by the RMC 120 related to rack power usage and rack thermal management, respectively. Further, management actions executed by the logic module 150 may be based upon the individual hardware characteristics and physical location of devices within the rack. Such information may be stored in storage 152 in a management table, as will be discussed in association with FIG. 4.

The RMC 120 further includes a console port 170 that is communicatively coupled to a management port of the network switch 124. In the illustrated embodiment, the console port 170 is a RS232 serial port that is configured to pass commands to and receive console output from a console serial port on the switch 124. The logic module 150 is further operable to route console I/O to the network 156 via the management ports 154. In this manner, the RMC 120 is operable to facilitate remote management of the switch by allowing a computing device not physically connected to the switch's console port to send commands to and receive data from the console port via the network 156. In certain embodiments, the RMC 120 may include a plurality of console ports 170 that respectively connect to multiple console-managed devices, such as routers, servers, and other switches.

In the rack system 100, some or all of the computing devices are cooled by fans external to the computing devices themselves. The RMC 120 is further configured to control such fans. In that regard, the RMC 120 includes a fan control port 172 that is communicatively coupled to one or more fan controllers 174 via a communication pathway 176 such as a system management bus (SMBus), an Inter-Integrated Circuit (PC) bus, a low pin count (LPC) bus, a serial-type bus, or any other type of wired or wireless bus known in the art. As shown in FIG. 3, each fan controller 174 controls a fan 178 that cools one or more computing devices mounted in the frame 102. For example, in the example embodiment of FIG. 3, servers 158 and 160 are cooled by the same fan 178 and servers 162 and 164 are cooled by the same fan 178. The logic module 150 within the RMC 120 is operable to monitor the thermal properties of the computing devices in the rack system 100 and control the fans associated with the computing devices in response to the detected thermal properties.

Figure 4:
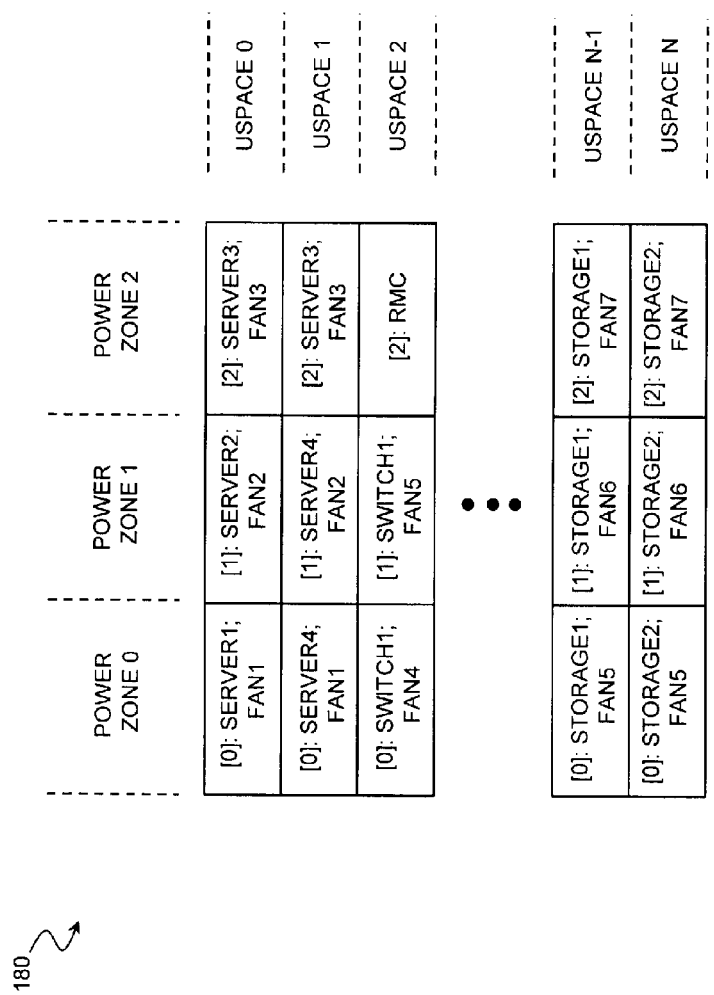
FIG. 4 is a simplified illustration of an example management table maintained by the RMC that stores management information about computing devices in the rack system.

Because the fans 178 are independent of the computing devices in the frame 102, the RMC 120 stores management information that maps each computing device to a specific fan and manages fan speeds based on the management information. In that regard, FIG. 4 is a simplified illustration of an example management table 180 maintained by the RMC 120 that stores management information about computing devices in the rack system 100, including information that associates the computing devices with the fans assigned to cool them. In more detail, the management table 180 associates physical locations within the frame 102 with the computing devices and fans that are located within them. For example, the management table 180 includes information about each uSpace in the frame 102 and each power zone within each uSpace. As shown in the example of FIG. 4, the management table 180 indicates that server 1 is mounted in uSpace 0/power zone 0 and that fan1 cools server 1. Devices and fans may span multiple uSpaces and/or power zones. For instance, server4 is mounted in both power zone 0 and 1 of uSpace 1 as indicated in management table 180. Further, as mentioned above, a single fan may cool more than one computing device. For example, management table 180 associates fan1 with both server1 and server4. In this manner, when the RMC 120 detects that a specific computing device in the rack system 100 needs additional cooling, it may utilize location information stored in the management table 180 to determine which fan needs to be speed adjusted.

In addition to associating a computing devices within the rack system 100 with physical locations within the frame 102, the management table 180 further stores hardware and operational characteristics of computing devices and fans in the rack system. The RMC 120 performs management tasks based upon such hardware characteristics information in combination with the physical location information described above. As an aspect of this, the management table 180 stores thermal attributes and fan control algorithm information associated with the computing devices in the rack system 100. That is, a computing device may have associated with it information dictating how much airflow a fan cooling the computing device should be outputting when the device is between various temperature thresholds. In the example of FIG. 4, the management table 180 may store a fan control algorithm (e.g., a pulse-width modulation (PWM) algorithm, etc) for server1 that dictates the speeds at which fan1 should be operating or the airflow fan1 should be producing. As such, in the event the RMC 120 detects that the heat produced server 1 is between two temperature thresholds, the RMC can set fan1 to operate at the speed dictated by the fan control algorithm stored in the management table 180. In some embodiments, the RMC 120 may be configured to perform additional computations related to fan control, such as fan speed to airflow computations based on fan and hardware characteristics. Additional fan control methods carried out by the RMC 120 will be discussed in association with FIG. 9.

As mentioned above, the management table 180 stores hardware and operational characteristics of computing devices in the rack system 100. In certain embodiments, the management table 180 may store for each computing device in the rack system some or all of the following information: physical location (uSpace, power zone, etc), device size (in physical dimensions and/or number of uSpaces, etc), device type (server, storage, switch, etc), device manufacturer and model, device boot priority (respective to other devices in the rack system), device hardware assets (processor type, memory amount, internal storage amount, peripherals, etc), device thermal attributes, device power usage, device fan control algorithms, device MAC address, device IP address, baseboard management controller (BMC) IP address, BMC software type and version. One of ordinary skill in the art would recognize that the above list is not limiting and the management table 180 may store various other additional and/or different information associated with the computing devices in the rack system 100. Methods and systems to initially configure and populate the management table 180 with configuration information will be discussed in association with FIGS. 5-7. Further one skilled in the art would recognize that the RMC 120 may store and organize information about computing devices within the rack system 100 in a variety of manners and the management table 180 is simply one example embodiment. Moreover, the structure of management table 180 shown in FIG. 4 is simply illustrative and the data represented by the management table may be stored by the RMC 120 in a variety of ways. In alternative embodiments, the RMC 120 may store location, hardware, and operational information about computing devices in one or more different and/or additional data structures such as in database tables, memory arrays, vectors, flat files, linked lists, hash tables, or any other data structures known in the art.

With reference back to FIGS. 2 and 3, the RMC 120 further includes two or more high-availability ports 186 that are respectively communicatively coupled to a failover RMC 188 and a failover RMC 190 that are disposed in other rack systems. During normal operations, RMC 120 and failover RMCs 188 and 190 each manage their own rack systems, but, in the event one of the RMCs fails, one or more of the remaining RMCs takes over management of the failed RMC's rack system to effect high-availability operations. In the illustrated embodiment, each high-availability port 186 is coupled to one of the failover RMCs via a communication link 192. In one embodiment, the communication link 192 is a low-bandwidth signaling link such as a SMBus link or serial link, but, in other embodiments, the communication link 192 is another type of link such as an Ethernet-based or wireless link. The logic module 150 is configured to transmit periodic messages (i.e., heartbeats) to the failover RMCs 188 and 190 to indicate that the RMC 120 is alive and operational. The logic module 150 similarly receives heartbeats from the failover RMCs 188 and 190 to indicate that they are alive and operational. In the event RMC 120 detects that it is no longer receiving heartbeats from either of the failover RMCs 188 and 190, the RMC 120 is configured query whether the failover RMC has actually failed, and, if so, begin managing the computing devices normally managed by the dead RMC. Additional details associated with the high-availability aspects of the RMC 120 are discussed in association with FIGS. 10 and 11.

In the illustrated embodiment of FIG. 2, the RMC 120 further includes a configuration port 192 that is communicatively coupled to the configuration bars 118 (FIG. 1), which are, in turn, coupled to some or all of the computing devices within the rack system 100. The RMC 120, via the configuration bars 118, is configured to detect when a new computing device is inserted into the frame 102, determine the physical location of the new computing device within the frame, and retrieve hardware configuration and attribute information from the new computing device. The physical location information and hardware configuration and attribute information are stored in the management table 180 so that the RMC 120 may perform computing device-specific management tasks that are dependent on physical location and hardware information.

Figure 5:
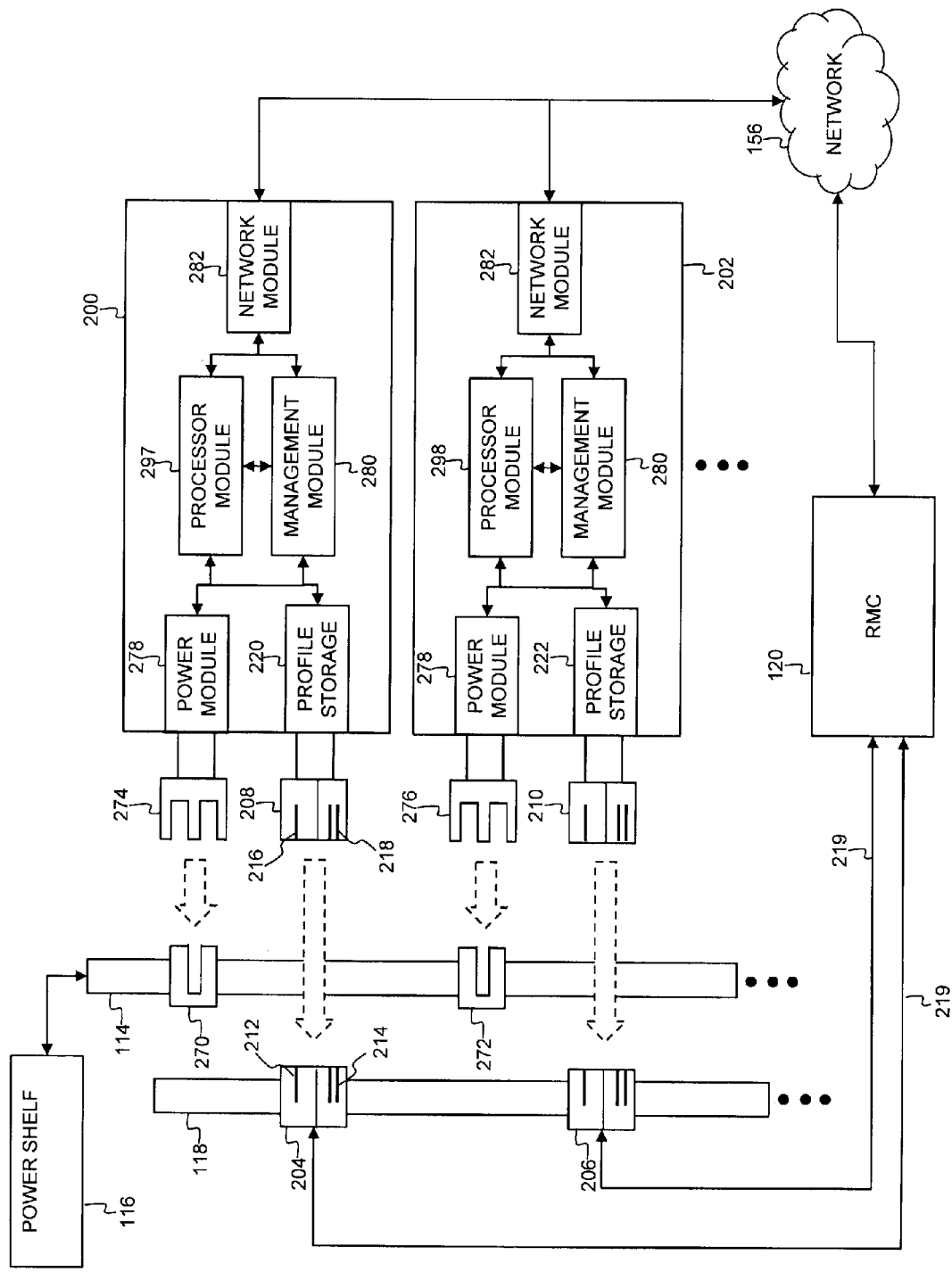
FIG. 5 is a functional block diagram of various components of the rack system of FIG. 1 including the RMC and a configuration bar.

In more detail, FIG. 5 is a functional block diagram of various components of the rack system 100 including the RMC 120, one of the configuration bars 118, one of the power bars 114, two servers 200 and 202 within the rack system, and interconnections therebetween according to aspects to the present disclosure. More specifically, FIG. 5 illustrates the manner in which RMC 120 determines the physical location and hardware attributes of computing devices, such as servers 200 and 202, within the frame 102. As discussed in association with FIG. 1, the frame 102 includes the configuration bars 118 to which computing devices couple when they are inserted into the frame. More specifically, for each slot within the frame 102 that a distinct computing device may be inserted (e.g., three slots per horizontal uSpace in the example of FIG. 1), the configuration bar 118 includes a blind-mating, bar coupling assembly. Computing devices configured for use in the rack system 100 each include a complementary device coupling assembly that mates with a respective one of the bar coupling assemblies when it is inserted into the frame 102. In the example of FIG. 5, the configuration bar 118 includes bar coupling assemblies 204 and 206 and the servers 200 and 202 respectively include device coupling assemblies 208 and 210. When a device coupling assembly is mated with a bar coupling assembly, an electrical connection is established and information about the computing device having the device coupling assembly, including its location, is transmitted through a communication link to the RMC 120. More specifically, in the illustrated embodiment, the bar coupling assembly 204 includes a sense contact 212 and data contacts 214, and the device coupling assembly 208 includes a complementary sense contact 216 and complementary data contacts 218. When an electrical connection is made between the sense contact 212 in the bar coupling assembly and the sense contact 216 in the device coupling assembly, an electrical signal is detected by the RMC 120 via the configuration port 192. The RMC 120 is configured to detect from which bar coupling assembly the electrical signal originated, wherein each bar coupling assembly is associated with a different physical location in the frame 102. The configuration port 192 includes sensing hardware that determines the origin of electrical signals generated by the sense contacts when a device is coupled to the configuration bar. In one embodiment, each bar coupling assembly may be mapped to a cell of the management table that represents a physical location within the frame 102. In this manner, the RMC 120 is operable to determine when a computing device has been inserted into the frame and the physical location of the computing device. In alternative embodiments, the RMC 120 may determine the physical location of a computing device within the frame using the bar coupling assemblies in different manners. For instance, in some embodiments, the bar coupling assembly and device coupling assembly may lack the sense contacts. In such embodiments, the RMC 120 may utilize the data contacts to both determine a location of a computing device and also retrieve information from the device's profile storage. For example, when a new computing device is mounted in the frame 102 and an electrical connection is established by the engagement of the data contacts within the coupling assemblies, the RMC 120 is configured to (1) use the existence of the electrical signal to detect from which bar coupling assembly the electrical signal originated (and thus determine the physical location), and (2) use the data-carrying capacity of the electrical signal to retrieve the management information from the device's profile storage.

Figure 6:
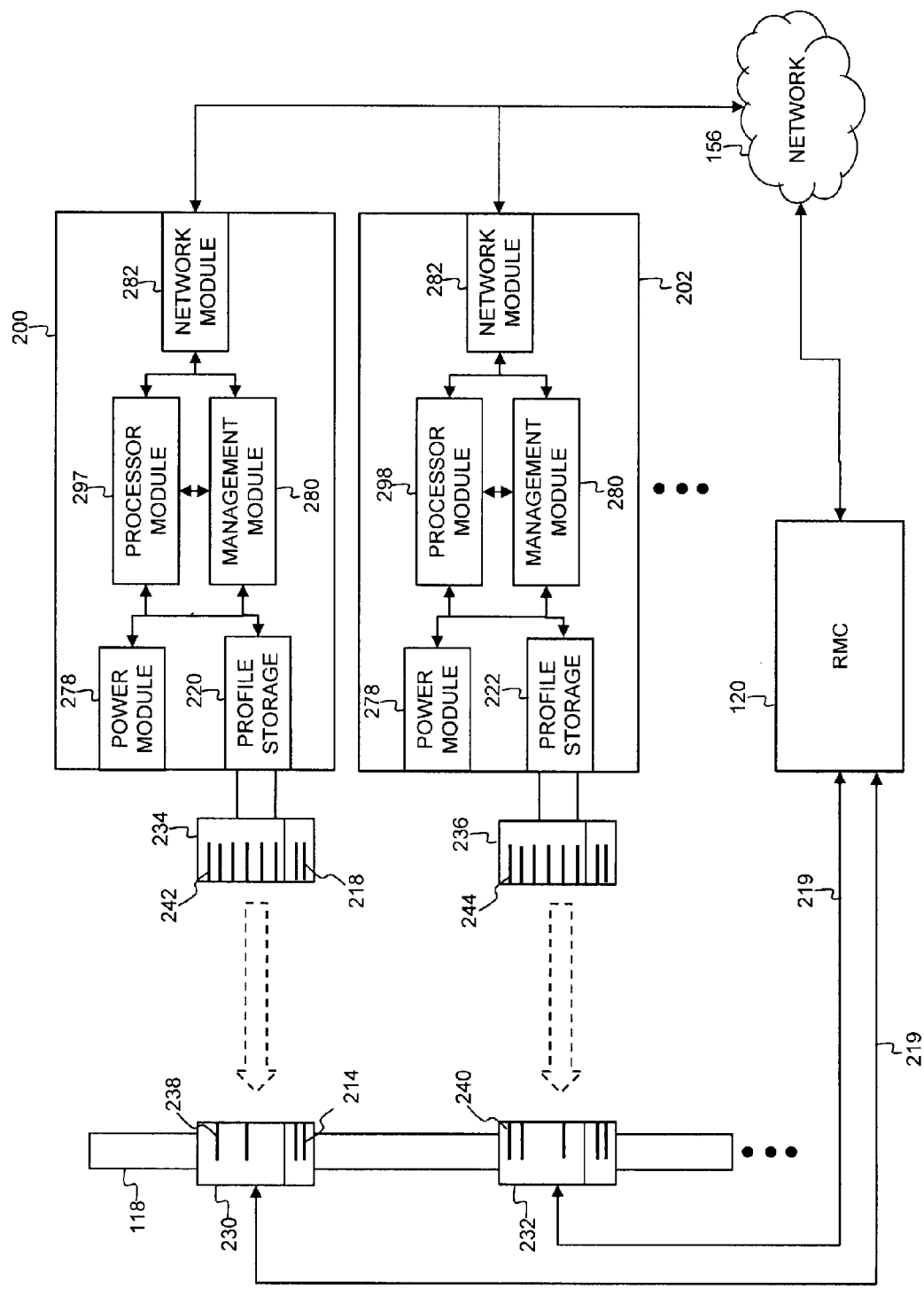
FIG. 6 is a functional block diagram of an alternative embodiment of portions of the rack system of FIG. 1 including the RMC and the configuration bar.

FIG. 6 illustrates a functional block diagram of an alternative embodiment of portions of the rack system 100 including the configuration bar 118 and RMC 120. Specifically, FIG. 6 is directed toward a further alternative structure for determining the physical location of a computing device within the frame 102. Like the configuration bar of FIG. 5, the configuration bar 118 of FIG. 6 includes bar coupling assemblies 230 and 232 that respectively mate with device coupling assemblies 234 and 236 on servers 200 and 202. However, the bar and device coupling assemblies shown in FIG. 6 each include a plurality of binary contacts rather than a single sense contact. In particular, the bar coupling assembly 230 includes binary contacts 238 that form a pattern representing a binary number that uniquely identifies the location of the bar coupling assembly 230 in the frame 102. In the example of FIG. 6, the bar coupling assembly 230 has contacts at binary positions 2 and 4 representing the number 001010. The bar coupling assembly 232 similarly includes binary contacts 240 that form a different binary number that identifies the physical location of the bar coupling assembly 232. The device coupling assemblies 234 and 236 on the servers 200 and 202 also include binary contacts 242 244 but each includes contacts at every binary position. That is, when bar coupling assembly 230 is mated with the device coupling assembly 234, electrical connections will only be established at the binary positions represented by the binary contacts 238 within the bar coupling assembly 230. The binary number represented by the selective electrical connections is thus transmitted to the RMC 120, which maps the binary number to a specific physical location within the frame 102. Thus, when a computing device is inserted into the frame 102 and it mates with the configuration bar 118, the RMC is configured to detect both the presence of a new computing device and its physical location without additional logic at the configuration port 192.

Referring now back to FIG. 5, when a device coupling assembly is mated with a bar coupling assembly, a further electrical connection is established via the data contacts. For example, when device coupling assembly 208 mates with bar coupling assembly 204, the data contacts 214 electrically couple with the data contacts 218. The resulting communication pathway is used to transfer hardware configuration and attribute information about a computing device to the RMC 120 for insertion into the management table 180. In that regard, the data contacts in the bar coupling assemblies may be communicatively coupled to the RMC 120 through a low-bandwidth communication link 219 such as a serial link (e.g., a RS232 link), an SMBus link, or a USB link. In other embodiments, the communication link 219 may be another type of communication link such as an Ethernet connection or a wireless connection. As an aspect of this, the computing devices configured for use in the rack system 100 each include a small amount of non-volatile storage that contains hardware configuration and attribute information about the computing device. In one embodiment, a computing device manufacturer programs the hardware configuration and attribute information into the computing device's profile storage before shipping the device. In the illustrated embodiment of FIG. 5, the server 200 includes a profile storage 220 and the server 202 includes a profile storage 222. For example, the profile storage 220 may store the following information about the server 200: device size (in physical dimensions and number of uSpaces, etc), device type (server, storage, switch, etc), device manufacturer and model, device hardware assets (processor type, memory amount, internal storage amount, peripherals, etc), device power up and power down timing, device thermal attributes, device power usage, device fan control algorithms, device MAC address, baseboard management controller (BMC) IP address, BMC software type and version. One of ordinary skill in the art would recognize that the above list is not limiting and the profile storage in various computing devices may store additional and/or different information. As described above, when the server 200 is inserted into the frame 102 and the device coupling assembly 208 mates with bar coupling assembly 204, the sense contacts 212 and 216 make an electrical connection that informs of the RMC 120 of the presence and location of the computing device 200. Upon such detection, the RMC 120 is configured to retrieve the information stored in the profile storage 220 of the server 200 via the communication path established by the data contacts 214 and 218.

One of ordinary skill in the art would recognize that the physical components depicted in the FIG. 5 have been simplified for illustration purposes and may not represent their actual physical forms. For instance, the device coupling assemblies 208 and 210 and the bar coupling assemblies 204 and 206 may take on a variety of physical forms and may establish electrical connections between the RMC 120 and servers 200 and 202 in a variety of manners, for instance, through electrical pins, sockets, plugs, magnets, latches, and the like.

Further, the system described above in FIG. 5 for extracting hardware configuration and attribute information from a newly-inserted computing device may be configured in various manners in alternative embodiments. For example, the transfer of hardware configuration and attribute information from a newly-inserted computing device to the RMC 120 may be accomplished over a short-range wireless connection, such as a radio-frequency (RF) connection or a Bluetooth connection. Specifically, in one embodiment, each computing device to be inserted in to the rack system 100 may include a RF chip that stores information about the associated computing device in place of a profile storage device. Such an RF chip may be disposed internally or externally to a computing device chassis. Additionally, in such an embodiment, the bar coupling assemblies on the configuration bar may be replaced with RF sensors that read the device information stored in the RF chips when computing devices are inserted into the frame 102. The RF sensors would then transmit the extracted information wirelessly or over wireline to the RMC 120. To associate an RF sensor with a specific slot in the frame 102 (i.e., uSpace/power zone), each RF sensor would only be configured to detect RF chips disposed within its associated slot. In this manner, the RMC 120 could detect via each RF sensor whether each slot in a rack frame is occupied or empty. The RMC could also determine the location of a specific computing device based on the identity and location of the RF sensor its RF chip is associated with. In some instances, this short-range wireless system would permit older rack systems to be retrofitted to work with the RMC 120 and its configuration table.

As mentioned above, the RMC 120 is configured to monitor the operational status of computing devices in the rack system 100. As an aspect of this, the RMC is operable to detect and report hardware failure events reported by the computing devices in the rack system, for instance, via their baseboard management controllers. Errors detectable by the RMC may include processors overheating, fan failures, memory errors, and other similar errors known in the art. When hardware-based events occur across the devices in the rack system, the RMC is operable to aggregate the errors and take some action to efficiently inform system administrators. For instance, the RMC may forward an aggregate error report to a management engine operating at a level higher than the RMC, for example, at the data center level. Further, in some embodiments, the RMC may be configured to autonomously take action based on a given error event. For instance, if a server reports a critical, internal fault, the RMC may boot up another server inside the rack so it can take over the functions of the failing server. In such a scenario, the RMC may alternatively send an alert to a larger management construct that would, in response, start a new server provisioning process that would spin up a replacement server for the one that failed.

Figure 7:
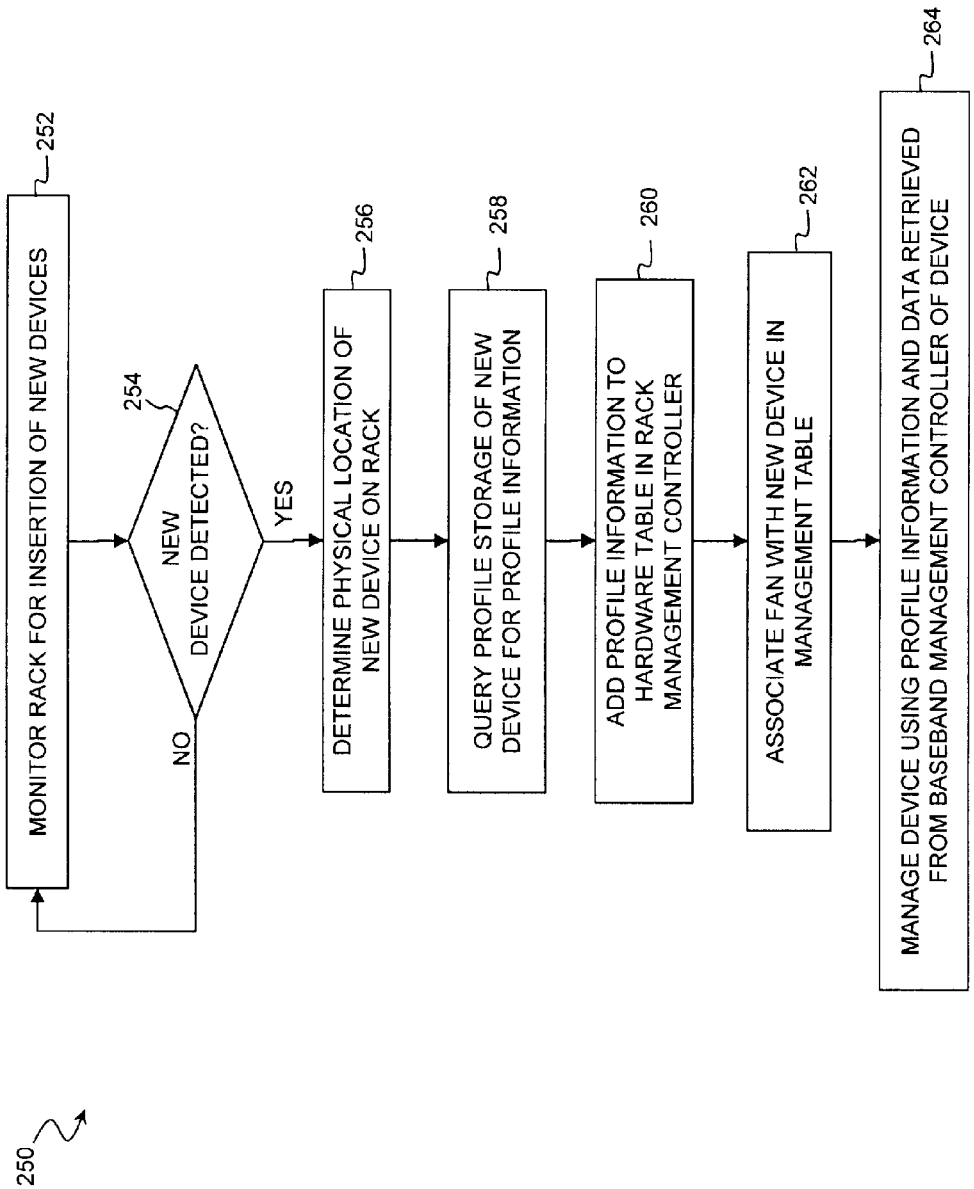
FIG. 7 is a simplified flow chart describing a method of initially configuring computing devices within the rack system.

Referring now to FIG. 7, illustrated is a simplified flow chart describing a method 250 of initially configuring computing devices within the rack system 100. The method 250 begins at block 252 where the RMC 120 monitors the rack system for insertion of new computing devices into the frame 102. As described in association with FIG. 5, the RMC 120 is configured to detect when an electrical connection is made between one or more contacts in a bar coupling assembly on the configuration bar 118 and one or more contacts in a device coupling assembly of a computing device. If a new computing device has been detected in decision block 254, the method 250 continues to block 256 where the RMC 120 determines the physical location of the new computing device within the frame 102. As discussed in association with FIGS. 5 and 6, the RMC 120 may both detect the presence and determine the physical location of computing devices by the electrical connections formed when a computing device is coupled to the configuration bar 118. In the embodiments in which the bar coupling assemblies include a single sense contact, the RMC 120 determines the physical location of a computing device based on the specific electrical connection incoming to the configuration port 192. In other embodiments in which the bar coupling assemblies include contact patterns that represent binary numbers, the RMC 120 determines physical location of a computing device based on the specific binary number transmitted to the RMC when the computing device is coupled to the configuration bar 118.

After the physical location of a newly-inserted computing device is determined, the method 250 moves to block 258 where the RMC 120 queries the profile storage in the computing device for hardware configuration and attribute information describing the device. As mentioned above, this profile information may include data about power usage, thermal characteristics, fan control algorithms, and other such information as described above. Next, in block 260, the RMC 120 adds the hardware configuration and attribute information retrieved from the new computing device to the management table 180, which associates the information with a physical location in the frame 102. Finally, to complete the initial setup of a new computing device inserted in to the rack system 100, the RMC 120 associates the fan that cools the computing device with the device in the management table 180. As such, when the management table 180 includes physical location, hardware configuration and attribute information, and fan information, the RMC 120 is operable to remotely monitor, command, and otherwise manage the new computing device. In that regard, as shown in block 264 of method 250, the RMC 120 manages the device using the information stored in the management table 180 and also information retrieved from a baseboard management controller (BMC) on the computing device. For instance, the RMC 120 may retrieve real-time temperature status information from the computing device's BMC and manage the fan associated with the computing device based on fan control algorithms retrieved from the device through the configuration bar 118 and stored in the management table 180. One of ordinary skill in the art would recognize that the method 250 of initially configuring computing devices within the rack system 100 is simply an example and the method may include additional and/or different blocks. For instance, the method 250 may include additional steps depending on the type of computing device is detected by the RMC 120.

Referring now back to FIG. 5, the some or all of computing devices mounted in the frame 102, such as servers 200 and 202, are powered by the power bar 114. As described in association with FIG. 1, the power shelf 116 energizes the power bar 114, which in turn, powers individual devices that are coupled to the power bar. In the illustrated embodiment of FIG. 5, the power bar 114 includes a blind-mating, hot-pluggable bar power coupler for each slot within the frame 102 that a distinct computing device may be inserted (e.g., three slots per horizontal uSpace in the example of FIG. 1). Computing devices configured for use in the rack system 100 each include a complementary device power coupler that mates with a respective one of the bar power couplers when it is inserted into the frame 102. In the example of FIG. 5, the power bar 114 includes bar power couplers 270 and 272 and the servers 200 and 202 respectively include device power couplers 274 and 276. When a device power coupler is mated with a bar power coupler, an electrical connection is established and power modules 278 within the servers 200 and 202 draw the power needed to operate the servers.

As an aspect of this, the RMC 120 is operable to perform a variety of power management tasks associated with the computing devices within the rack system 100. The RMC 120 does so through management modules 280 in the servers 200 and 202, which expose out-of-band management functionality to management controllers like the RMC. In one embodiment, the management modules 280 are baseboard management controllers (BMCs) such as Intel® Management Engines, but in other embodiments, the management modules 280 may be other types of controllers known in the art. Further, the management modules 280 may be different in different computing devices within the rack system 100. The RMC 120 is operable to communicate with the management modules 280 through the network 156 and network modules 282 within the servers 200 and 202. As discussed above, the RMC 120 is configured to remotely power up, power down, power cycle, put into standby, wake up from standby, and vary a processor clock speed of a computing device via its management module 280. The RMC 120 leverages this out-of-band functionality to perform a variety of power management tasks associated with the computing devices within the rack system 100.

For instance, the RMC 120 is operable to control the sequence and timing of the startup and shutdown of computing devices drawings power from the power bar 114. To avoid a large power draw due to all computing devices in a rack system powering up at once, the RMC 120 may stagger the startup times of the devices. For example, in a simple embodiment, the RMC 120 may insert delays of specific times between sending power up signals to various computing devices. However, in other embodiments, the RMC 120 may determine power up times and sequences dynamically based on the types, dependencies, and priorities of devices within the rack. For example, the RMC 120 may build a startup vector (or other data structure) that defines sequence and timing using the information stored in the management table 180, including physical location and hardware configuration and attribute information. In one embodiment, a startup vector is built with priority information stored in the management table 180, with different types of devices having different priority levels. For instance, network switches may have a top priority indicating that they should be powered on before any other devices in a rack, storage devices (e.g., JBODs) may have a medium priority level, and servers may have a low priority level to indicate that they should be powered on after any storage devices. Moreover, the management table 180 may additionally include information describing the startup times of the devices in the rack. For instance, the management table 180 may indicate that a database server may take five minutes to reach a ready state after given an initial power-on signal from the RMC 120. In one embodiment, the priority level and startup timing information about a computing device may be predetermined by a manufacturer and stored in the device's profile storage, such that the information is inserted into the management table 180 when the device is first mounted in the rack. In certain embodiments, priority levels of specific computing devices may customized by a user after the priority information has been inserted into the management table 180, for instance, to change the order in which specific devices start up. As such, in an exemplary embodiment, when the RMC 120 receives a command to power up all devices in the rack system, it queries the management table 180 for priority and startup time information associated with each device and dynamically builds a startup vector that defines the sequence and timing of when the RMC should send power up signals to the devices.

A further power-related management task performed by the RMC 120 is intelligently provisioning computing devices in an on-demand hardware environment (i.e., metal-as-a-service (MAAS)). For instance, in one embodiment the rack system 100 includes a plurality of computing devices that are interchangeable resources in a scalable compute cloud. In such an embodiment, the RMC 120 is configured to intelligently select which computing device in the rack should be powered on in response to an incoming resource request. If multiple machines within a rack may be used to fulfill a resource request, the RMC 120 applies one or more criteria to choose which machine to power on. In one example, the RMC 120 selects computing devices based on their physical location within the frame 102, as described in the management table 180. In that regard, it may be advantageous to power-on machine that are closest to a cooling source, as computing devices run more efficiently at cooler temperatures. In the example of traditional data centers, cool air may emanate from the floor, so the RMC 120 may preferably power-on the computing device most near to the bottom of the frame 102.

The RMC 120 may additionally utilize other criteria to select which computing device in the rack should be powered-on in response to an incoming resource request. For instance, such a selection may be based on run-time hours of the computing devices in the rack system 100. In one embodiment, the RMC 120 selects computing devices so as to distribute run-time hours evenly across the rack system 100. When a resource request is received by the RMC 120, it queries either the management modules of the computing devices or the management table 180 to determine the run-time hours of the device, and, in one example, selects the device with the least number of run-time hours. Such a provisioning criteria may prolong the average life of computing devices in the rack system 100. One of ordinary skill in the art would recognize that various other criteria may be utilized by the RMC to intelligently select a computing device in response to a resource request.

In addition to provisioning bare metal hardware resources for on-demand computing, the RMC is also operable in one embodiment to provision virtual resources within the computing devices in the rack system under its management. For instance, an on-demand computing system may request that a new virtual machine instance should be instantiated on a computing device within the rack system 100. The RMC 120 is configured to dynamically select the specific computing best suited for the virtual machine. Using hardware attribute information contained in the management table 180 and also real-time operational status information retrieved from the computing devices' BMCs, the RMC 120 may choose a computing device based on a variety of criteria. For instance, the RMC 120 may first select the plurality of computing device within the rack system 100 that meet the hardware requirements of the virtual machine. Out of this subset of devices, the RMC 120 may then select the device that is operating at the lowest temperature to host the virtual machine. Any number of additional criteria may be utilized by the RMC to select a virtual machine host. As an aspect of this, because the RMC 120 maintains hardware attributes of each device in its managed rack, the RMC may create device-appropriate deployment scripts for operating systems being deployed within the rack system.

The RMC 120 further is operable to monitor the aggregate power usage of the computing devices within the rack system 100 and perform management tasks in response. In one embodiment, the RMC 120 is configured to set a total power usage limit for the rack system 100 and dynamically take actions to reduce power usage if the limit has been exceeded. It may be advantageous to cap the power usage of a rack to some amount lower than full load to create power usage vs. compute power efficiencies. For instance, the total wattage drawn by a rack system under full load may be 11,748 watts, but by imposing a limit at 10,000 watts, a significant amount of power may be saved, and any resultant performance hit may be negligible. In that regard, FIG. 8 is a simplified flow chart describing a method 284 for managing total power usage of the computing devices within the rack system 100. In more detail, the method 284 begins at block 286 where an upper threshold for aggregate power usage of the computing devices within the rack system 100 is established. In some embodiments, the RMC 120 automatically sets the upper threshold based on factors such as the power output capability of the power shelf 116 (FIG. 1), power usage vs. compute power efficiency data, and/or a variety of other factors. But, in other embodiments, a rack administrator may manually set a power usage threshold, for example, through a user interface exposed by the RMC 120. Next, in block 288, the RMC 120 monitors real-time power usage of each of the computing devices within the rack system. As mentioned above, the RMC 120 is operable to query the management modules (e.g. BMCs) of the computing devices for their real-time power usage data. In some embodiments, the RMC 120 stores the retrieved power usage information in the management table 180 in association with the respective computing device.

The method 284 then proceeds to block 290 where the RMC 120 aggregates the power usage information to determine the total power usage of the rack system. In some embodiments, a total power usage calculation may be performed at periodic intervals during operation of the rack system 100, but, in other embodiments, the RMC 120 may maintain a running total power usage number that is updated in real-time when additional power usage data is retrieved from individual computing devices. In decision block 292, the calculated total power usage is compared to the upper power usage threshold. If the calculated usage is below the threshold, the method 284 returns to block 288 and the RMC 120 continues to monitor the power usage of the individual computing devices. If instead the calculated usage is above the threshold, the method 284 proceeds to block 294 where the RMC 120 dynamically selects one or more devices as a power reduction target. The RMC 120 may apply various criteria to determine for which device or devices power usage should be reduced such that total power usage of the rack is lowered below the threshold. For instance, the RMC 120 may select power reduction targets based on the current thermal characteristics of the computing devices, as monitored through the devices'BMCs. In such an embodiment, the RMC may select the computing devices that are running at temperatures above their normal operating temperatures, or it may select computing devices based on their temperature relative to other similar devices in the rack (i.e., select the server with the highest temperature processor). In other embodiments, the RMC 120 selects power reduction targets based on priority level or run-time hours maintained in the management table 180 (i.e., a server with a low priority will be selected before a server with a high priority). After one or more power reduction targets have been selected in block 294, the method 284 proceeds to block 296, where power usage of the selected targets is reduced until the total power usage of the rack system is below the threshold. The RMC 120 may reduce power usage in a variety of manners. For instance, if servers 200 and 202 in FIG. 5 are selected as power reduction targets, the RMC 120 may step down the clock speed of the respective processor modules 297 and 298 via their management modules 280. In one embodiment, the RMC 120 may select most or all of the computing devices in the rack system 100 that have speed-adjustable processors, and decrease operating speed of each device a small (i.e., negligible) amount so as to spread out the necessary power drop across the rack system, rather than subjecting a few devices to significant power drops and the resultant performance hits. In other embodiments, when the total power usage is significantly above the upper threshold, the RMC 120 may power-down the selected computing devices. After actions to curtail power usage by the selected computing devices have been made, the method 284 returns to block 288 where the RMC 120 continues to monitor the power usage of the computing devices in the rack system 100. One of ordinary skill in the art would recognize that the method 284 for managing total power usage of the computing devices within the rack system 100 is simply an example and the method may include additional and/or different steps.

Referring now to FIG. 9, illustrated is a simplified flow chart describing a method 300 for managing thermal characteristics of the computing devices within the rack system 100. Specifically, method 300 describes a management task performed by the RMC 120 to adjust fan speed in the embodiments in which fans are external to and independent of the computing devices and a single fan may be assigned to cool multiple computing devices. (see FIG. 3). The method 300 begins at block 302 where the RMC 120 monitors real-time thermal characteristics of the computing devices within the rack system 100. As mentioned above, the RMC 120 is operable to query the management modules (i.e., BMCs) of the computing devices for their individual temperature data. In some embodiments, the RMC 120 stores the retrieved thermal information in the management table 180 in association with the respective computing device. Next, in block 304 the RMC 120 applies the fan control algorithms of each computing device (as stored in the management table 180) to the temperature data collected in block 302. Specifically, as described above in association with FIG. 4, each computing device may have associated with it information dictating how much airflow a fan cooling the computing device should be outputting based on a device temperature. For example, the management table 180 may store a pulse-width modulation (PWM) algorithm for a server that dictates the speeds at which a PWM-based cooling fan should be operating or the airflow the fan should be producing. For each computing device, the RMC 120 applies the PWM algorithm to the current device temperature to determine an appropriate fan speed for the fan associated with the computing device. As mentioned above, the management table 180 maps the computing devices in the frame 102 to the fans cooling them.

In decision block 306, the RMC 120 determines whether the fan associated with a first computing device is operating at the appropriate calculated speed. In the embodiment of FIGS. 2 and 3, the logic module 150 of the RMC 120 makes this determination by querying the fan controller associated with the fan via the communication pathway 176. If the current fan speed is approximately equal to the calculated speed, the method 300 returns to block 302 and the RMC 120 continues to monitor the thermal characteristics of the rack devices. If a fan speed adjustment is needed based on the thermal information gathered from the first device, the method 300 proceeds to decision block 308 where the RMC determines whether the first device shares the fan with another device using the fan-to-device mapping of the management table 180. If the fan exclusively cools the first device, the method proceeds to block 310 where the fan speed is adjusted to the speed calculated in block 304. If however, the first device shares the fan with a second device, then the method continues to block 312 where the RMC 120 applies the second device's fan control algorithm to the current temperature of the second device to determine an appropriate fan speed for a fan cooling the second computing device. Next, in block 314, the RMC 120 sets the fan speed to the higher of the speed calculated for the first device in block 304 and the fan speed calculated for the second device in block 314. In this manner, when two or more devices share the same fan, the computing device with the highest airflow demands will be adequately cooled. One of ordinary skill in the art would recognize that the method 300 for managing thermal characteristics of the computing devices within the rack system 100 is simply an example and may include additional and/or different steps. For instance, the RMC 120 may perform any number of additional calculations to determine an adequate fan speed for computing devices, such as calculations necessary to account to ambient temperature and fan size. Further, portions of the method 300 may be repeated depending in the number of computing devices cooled by the same fan.

In alternative embodiments, each computing device may itself manage the external fan cooling it. In such embodiments, a computing device's baseboard management controller may monitor its temperature and send a signal to the RMC when a fan speed control change is needed. Upon receiving the speed change request, RMC would determine from the management table which fan is mounted adjacent to the computing device and forward the request on to the correct fan controller. In the case that conflicting fan speed requests are received from computing devices that share a fan, the RMC would defer to the computing device with the greater cooling needs, in a manner similar to that illustrated above in FIG. 9.

Figure 10:
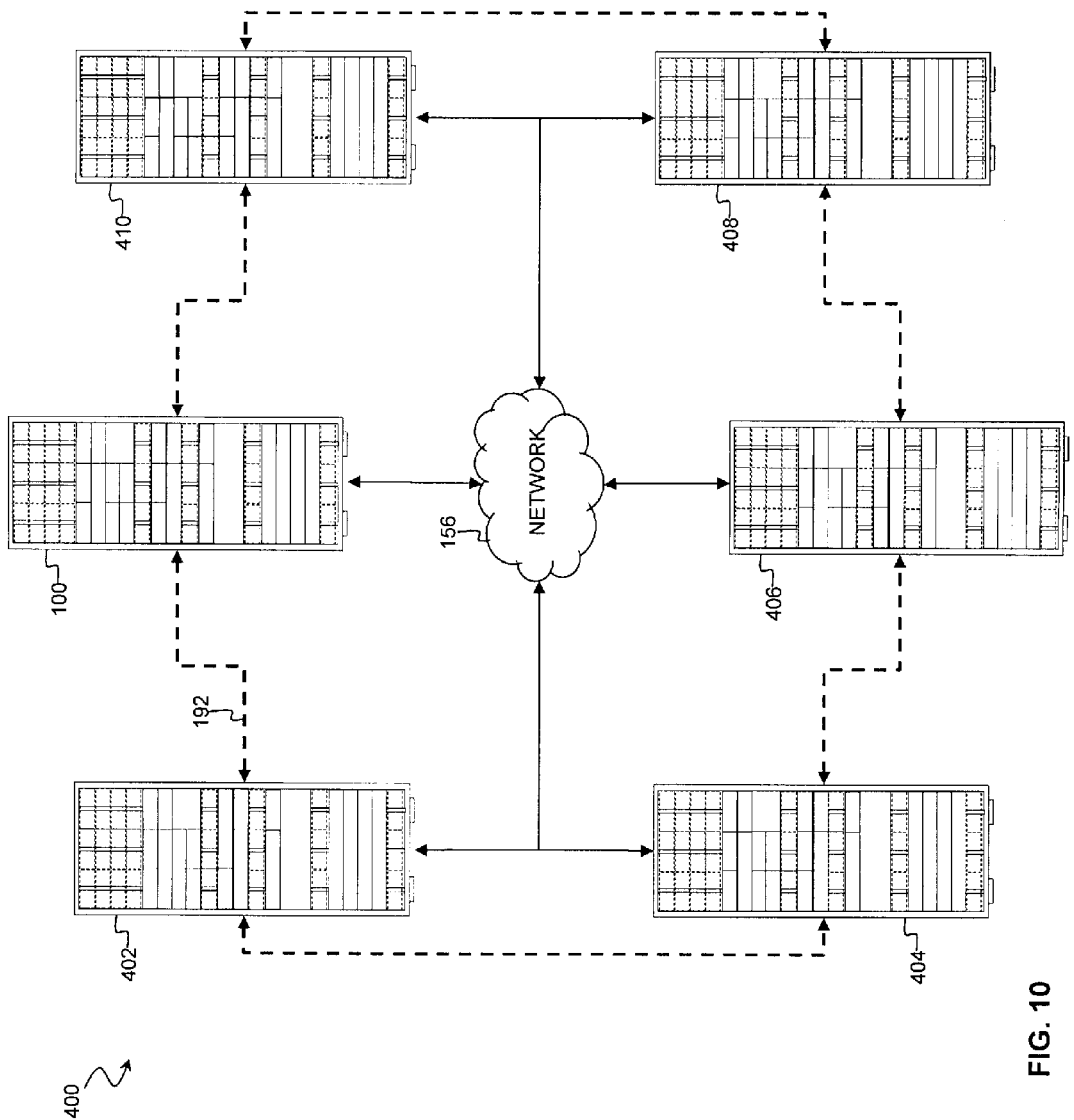
FIG. 10 is a functional block diagram of a high-availability rack management system according to aspects of the present disclosure.

Referring now to FIG. 10, illustrated is a functional block diagram of a high-availability rack management system 400 according to aspects of the present disclosure. As discussed in association with FIGS. 2 and 3, the RMC 120 that manages rack system 100 is backed-up by one or more failover RMCs that each manage their own respective rack system. And, in the event that RMC 120 fails, one of the failover RMCs will take over management of the rack system 100. In the illustrated embodiment of FIG. 10, the RMC 120 in rack system 100 is backed-up by failover RMCs on a plurality of other rack systems 402, 404, 406, 408, and 410. As described in association with FIG. 3, the RMC 120 is physically coupled to RMCs in rack systems 402 and 410 via the communication link 192. However, the RMC 120 is communicatively coupled to RMCs in rack systems 404, 406, and 408 via the rack systems 402 and 410 for form a high-availability network. This ring-style communication network enables any of the RMCs in rack systems 100, 402, 404, 406, 408, and 410 to take over management of any other RMC. As one aspect of this, each RMC in the high-availability network includes a copy of management tables from each of the other RMCs in the network. As such, when a RMC fails, another RMC can manage the failed RMCs rack system using the correct management table. Although FIG. 10 illustrates a separate low-bandwidth communication link 192 communicatively coupling the RMCs, all high-availability tasks (e.g., heartbeats, failover) may be alternatively performed over the network 156 that interconnects the rack systems. Additional details of the high-availability failover process are discussed in association with FIG. 11.

Figure 11:
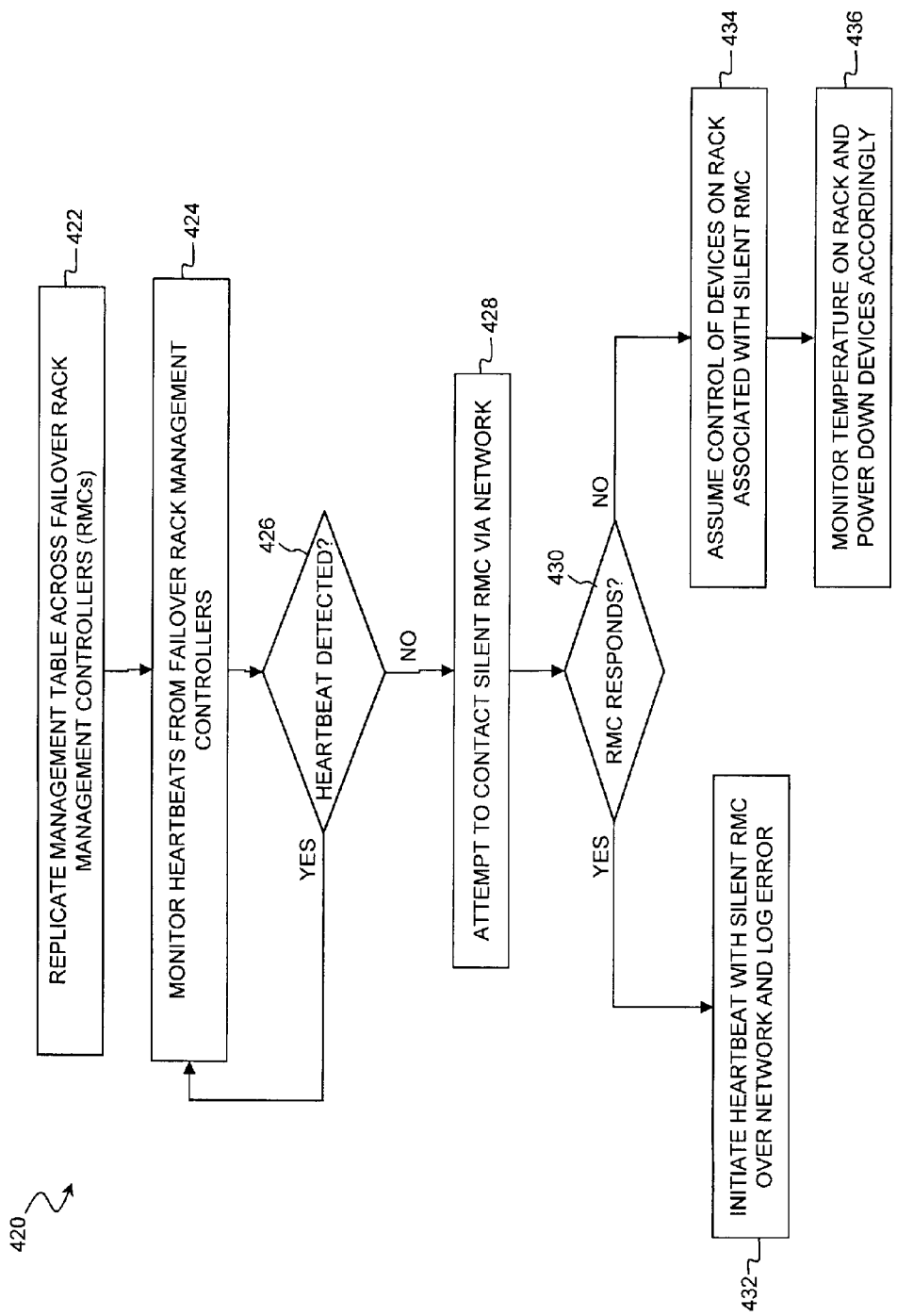
FIG. 11 is a simplified flow chart describing a method for managing rack systems in a high-availability network according to aspects of the present disclosure.

In that regard, FIG. 11 is a simplified flow chart describing a method 420 for managing rack systems in a high-availability network according to aspects of the present disclosure. The method 420 begins at block 422 where management tables of RMCs within the high-availability network are replicated across the network. That is, each RMC in the network has copies of the management tables from the other RMCs in the network. In one embodiment, management table replication occurs periodically on a schedule so that the RMCs have up-to-date copies of the others' management tables. In other embodiments, replication is event driven. For example, an RMC will initiate replication of its management table after a new computing device has been inserted into its rack system and the device's physical location and hardware information has been added to the management table. The method 420 next proceeds to block 424 where the RMCs exchange heartbeats over the communications link 192 to inform each other of their operational status. In some embodiments, the heartbeats are simple pings, but, in other embodiments, the heartbeats may include additional information such as operational statistics. In a further embodiment, each heartbeat transmitted by a RMC includes a copy of its management table that can be stored by the other RMCs. Each management table received in a heartbeat from a specific RMC would replace the management table received in the previous heartbeat from the same RMC. As such, when a heartbeat is no longer detected from a failed RMC, the replicated management table associated with that failed RMC will be up-to-date as of the last heartbeat received from the failed RMC.

In decision block 426, a first RMC determines whether it is receiving heartbeats from every known RMC in its high-availability network. If it is, the first RMC continues to monitor for heartbeats in block 424. If the first RMC instead detects that it is no longer receiving heartbeats from a second RMC, then the method 420 proceeds to block 428 where the first RMC attempts to contact the second (silent) RMC over the network 156 (for example, by pinging its management port) and inquire as to its status. In decision block 430, if the second RMC responds, the method proceeds to block 432 where the first and second RMCs begin exchanging heartbeats over the network 156 (as opposed to the communication link 192). An error is logged indicating a problem with the communication link 192. If, however, the second RMC does not respond, the method 420 continues to block 434 where the first RMC begins managing the devices on the rack system previously managed by the second RMC. As an aspect of this, the first RMC loads into memory the management table previously replicated from the second RMC. This enables the first RMC to discover the IP address of the BMCs of the computing devices in the rack system previously managed by the second RMC. The management table of the second RMC also includes the physical location and hardware attributes of computing devices in the second RMC's rack, which the first RMC may use to remotely perform management tasks via the network 156. The first RMC continues to manage the computing devices in its own rack system. In one embodiment, as part of the failover process, the first RMC sends an alert to system administrators indicating that the second RMC has failed. In the embodiments in which a logic module within an RMC directly manages fan controllers within the rack system to control fan speed (see FIGS. 2 and 3), a remote RMC that takes over control of a failed RMC may not have control of the fan controllers, as they are not independently accessible through the network 156. In those embodiments, the method 420 proceeds to block 436 where the first RMC continuously monitors the thermal characteristics of the devices within the failed RMC's rack system. If the first RMC detects that the temperature of a device is over a critical threshold, the first RMC will first step down the processor speed of the device and, if the temperature does not fall below the threshold, send a shutdown signal to the device's BMC. In one embodiment, if a fan controller within a rack system detects that the system's RMC has failed—through lack of communication or otherwise—the fan controller will set the fans under its control to a default speed, such as full speed. One of ordinary skill in the art would recognize that the method 420 for managing rack systems in a high-availability network is simply an example and may include additional and/or different steps. For instance, an RMC taking over for a failed RMC may perform any number of additional actions to ensure the health of the computing devices previously managed by the failed RMC.

Even though illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A high availability rack management method, comprising:
   receiving, at a first rack management controller configured to manage a first rack system, management information from a second rack management controller configured to manage a second rack system different than the first rack system, the management information being associated with computing devices disposed in the second rack system;
   receiving, at the first rack management controller, periodic heartbeat messages from the second rack management controller;
   detecting that the first rack management controller ceases receiving the periodic heartbeat messages from the second rack management controller and, responsive to the detection, transmitting, with the first rack management controller, a status inquiry message for inquiring a status of the second rack management controller to the second rack management controller; and
   determining that the second rack management controller fails to respond to the status inquiry message and, responsive to the determination, managing, with the first rack management controller, the computing devices disposed in the second rack system using the management information.

2. The high availability rack management method of claim 1, wherein receiving the periodic heartbeat messages includes receiving the periodic heartbeat messages over a point-to-point communication link between the first rack management controller and the second rack management controller.

3. The high availability rack management method of claim 2, wherein the point-to-point communication link is a low-bandwidth signaling link selected from one of a system management bus (SMBus) link and a serial link.

4. The high availability rack management method of claim 2, wherein the transmitting the status inquiry message includes transmitting the status inquiry message over a second communication link between the first rack management controller and the second rack management controller different than the point-to-point communication link.

5. The high availability rack management method of claim 4, wherein the second communication link is an Ethernet link.

6. The high availability rack management method of claim 1, wherein the management information includes addresses of management modules disposed in the computing devices in the second rack system.

7. The high availability rack management method of claim 1, wherein the management information includes attributes of computing devices in the second rack system.

8. The high availability rack management method of claim 1, further including repeating the receiving the management information at periodic time intervals.

9. The high availability rack management method of claim 1, wherein the receiving the management information includes the second rack management controller transmitting the management information to the first rack management controller in response to a change to the management information.

10. The high availability rack management method of claim 1, wherein receiving the periodic heartbeat messages includes receiving the management information within each periodic heartbeat message.

11. The high availability rack management method of claim 1, wherein managing, with the first rack management controller, the computing devices disposed in the second rack system includes monitoring thermal characteristics of the computing devices in the second rack system.

12. The high availability rack management method of claim 11, wherein monitoring the thermal characteristics includes reducing, with the first rack management controller, power consumption of at least one computing device in the second rack system if a temperature of the at least one computing device exceeds a threshold.

13. The high availability rack management method of claim 1, further including, if the second rack management controller fails to respond to the status inquiry message, transmitting an alert message.

14. The high availability rack management method of claim 1,
further including transmitting, with the first rack management controller, further management information to the second rack management controller, the further management information being associated with computing devices disposed in the first rack system; and
further including transmitting, with the first rack management controller, further periodic heartbeat messages to the second rack management controller.

15. A high availability rack management system, comprising:
a first rack system having a first plurality of computing devices therein;
a first rack management controller communicatively coupled to each of the first plurality of computing devices and configured to manage each of the first plurality of computing devices using management information about the first plurality of computing devices;
a second rack system having a second plurality of computing devices therein;
a second rack management controller communicatively coupled to each of the second plurality of computing devices and configured to manage each of the second plurality of computing devices, the second rack management controller being further configured to store a copy of the management information about the first plurality of computing devices; and
a first communication link communicatively coupling the first rack management controller to the second rack management controller and configured to carry periodic heartbeat messages transmitted from the first rack management controller to the second rack management controller;
wherein the second rack management controller is configured to:
detect a failure of the first rack management controller to transmit the periodic heartbeat messages and, responsive to the detection, transmit a status inquiry message for inquiring a status of the first rack management controller to the first rack management controller, and
manage the first plurality of computing devices in the first rack system using the copy of the management information responsive to a determination that the first rack management controller fails to respond to the status inquiry message.

16. The high availability rack management system of claim 15, wherein the first communication link is a point-to-point communication link between the first rack management controller and the second rack management controller.

17. The high availability rack management system of claim 15, wherein the second rack management controller is configured to transmit the status inquiry message over a second communication link between the first rack management controller and the second rack management controller different than the first communication link.

18. The high availability rack management system of claim 15, wherein the management information includes attributes of each of the first plurality of computing devices.

19. The high availability rack management system of claim 15, wherein the first rack management controller is further configured to transmit the copy of the management information to the second rack management controller in response to a change to the management information.

20. The high availability rack management system of claim 15, wherein each periodic heartbeat message includes the copy of the management information.

21. The high availability rack management system of claim 15,
wherein the first rack management controller is further configured to store a copy of further management information about the second plurality of computing devices in the second rack system; and
wherein the first communication link is further configured to carry further periodic heartbeat messages transmitted from the second rack management controller to the first rack management controller.

22. A high availability rack management system, comprising:
a first plurality of computing devices;
a first rack management controller communicatively coupled to each of the first plurality of computing devices configured to manage each of the first plurality of computing devices using first management information about the first plurality of computing devices, the first rack management controller having a non-transitory, computer-readable storage medium that stores a plurality of instructions for execution by at least one processor, wherein the instructions comprise:
instructions to receive second management information from a second rack management controller configured to manage a second plurality of computing devices, the second management information being associated with the second plurality of computing devices;
instructions to receive periodic heartbeat messages from the second rack management controller;
instructions to transmit a status inquiry message for inquiring a status of the second rack management controller to the second rack management controller responsive to detecting that the first rack management controller ceases receiving the periodic heartbeat messages; and
instructions to manage the second plurality of computing devices using the second management information responsive to determining that the second rack management controller fails to respond to the status inquiry message.

23. The high availability rack management system of claim 22, wherein the instructions to receive the periodic heartbeat messages include instructions to receive the periodic heartbeat messages over a point-to-point communication link between the first rack management controller and the second rack management controller.

24. The high availability rack management system of claim 23, wherein the point-to-point communication link is a low-bandwidth signaling link selected from one of a system management bus (SMBus) link and a serial link.

25. The high availability rack management system of claim 23, wherein the instructions to transmit the status inquiry message include instructions to transmit the status inquiry message over a second communication link between the first rack management controller and the second rack management controller different than the point-to-point communication link.

26. The high availability rack management system of claim 22, wherein the second management information includes addresses of management modules disposed in each of the second plurality of computing devices.

27. The high availability rack management system of claim 22, wherein the second management information includes attributes of each of the second plurality of computing devices.

28. The high availability rack management system of claim 22, wherein the instructions to receive the periodic heartbeat messages include instructions to receive the second management information within each periodic heartbeat message.

29. The high availability rack management system of claim 22, wherein the instructions to manage the second plurality of computing devices include instructions to monitor thermal characteristics of each of the second plurality of computing devices.

30. The high availability rack management system of claim 22, wherein the plurality of instructions further include:
   instructions to transmit the first management information to the second rack management controller; and
   instructions to transmit further periodic heartbeat messages to the second rack management controller.

31. The high availability rack management system of claim 30, wherein the instructions to transmit the first management information include instructions to transmit the first management information in response to a change to the first management information.

* * * * *